United States Patent
Nagami et al.

(10) Patent No.: US 11,776,795 B2
(45) Date of Patent: Oct. 3, 2023

(54) PLASMA PROCESSING APPARATUS AND POWER SUPPLY CONTROL METHOD

(71) Applicant: TOKYO ELECTRON LIMITED, Tokyo (JP)

(72) Inventors: Koichi Nagami, Miyagi (JP); Tatsuro Ohshita, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 170 days.

(21) Appl. No.: 16/393,319

(22) Filed: Apr. 24, 2019

(65) Prior Publication Data
US 2019/0333744 A1   Oct. 31, 2019

(30) Foreign Application Priority Data

Apr. 27, 2018   (JP) ................. 2018-087194

(51) Int. Cl.
*H01J 37/32*   (2006.01)
*H01L 21/683*   (2006.01)
*H01L 21/67*   (2006.01)

(52) U.S. Cl.
CPC .. *H01J 37/32935* (2013.01); *H01J 37/32724* (2013.01); *H01L 21/6833* (2013.01); *H01J 37/32467* (2013.01); *H01J 37/32495* (2013.01); *H01J 2237/002* (2013.01); *H01J 2237/24564* (2013.01); *H01J 2237/334* (2013.01); *H01L 21/67069* (2013.01)

(58) Field of Classification Search
USPC ................... 156/345.47; 118/723 e
See application file for complete search history.

(56) References Cited

U.S. PATENT DOCUMENTS

| | | | | |
|---|---|---|---|---|
| 4,622,094 A | * | 11/1986 | Otsubo | H01J 37/32706 204/192.32 |
| 2015/0206722 A1 | * | 7/2015 | Yamamoto | H01J 37/32559 156/345.51 |
| 2017/0358431 A1 | * | 12/2017 | Dorf | H01J 37/32146 |
| 2019/0088520 A1 | * | 3/2019 | Kraus | H01J 37/32568 |

FOREIGN PATENT DOCUMENTS

| | | |
|---|---|---|
| JP | 2017-147370 A | 8/2017 |
| JP | 2017-201611 A | 11/2017 |

* cited by examiner

*Primary Examiner* — Ram N Kackar
(74) *Attorney, Agent, or Firm* — WEIHROUCH IP

(57) ABSTRACT

A plasma processing apparatus includes: a placement table serving as a lower electrode and configured to place thereon a workpiece to be subjected to a plasma processing; a DC power supply configured to alternately generate a positive DC voltage and a negative DC voltage to be applied to the placement table; and a controller configured to control an overall operation of the plasma processing apparatus. The controller is configured to: measure a voltage of the workpiece placed on the placement table; calculate, based on the measured voltage of the workpiece, a potential difference between the placement table and the workpiece in a period during which the negative DC voltage is applied to the placement table; and control the DC power supply such that a value of the negative DC voltage applied to the placement table is shifted by a shift amount that decreases the calculated potential difference.

12 Claims, 9 Drawing Sheets

PLASMA PROCESSING APPARATUS AND POWER SUPPLY CONTROL METHOD

CROSS-REFERENCE TO RELATED APPLICATIONS

This application is based on and claims priority from Japanese Patent Application No. 2018-087194, filed on Apr. 27, 2018 with the Japan Patent Office, the disclosure of which is incorporated herein in its entirety by reference.

TECHNICAL FIELD

The present disclosure relates to a plasma processing apparatus and a power supply control method.

BACKGROUND

A plasma processing apparatus that performs a plasma processing (e.g., an etching processing) on a workpiece (e.g., a semiconductor wafer) using plasma has been known in the related art. Such a plasma processing apparatus includes a placement table within a processing container that is designed to be capable of forming a vacuum space therein. The placement table is configured to place a workpiece therein and also functions as an electrode of the plasma processing apparatus. In the plasma processing apparatus, a plasma processing is performed on the workpiece placed on the placement table by applying, for example, a predetermined radio-frequency power to the placement table. In some cases, the plasma processing apparatus applies radio-frequency power to the placement table for bias purpose when the plasma processing is performed. By applying radio-frequency power to the placement table for bias purpose, the ions in the plasma are drawn into the workpiece. See, for example, Japanese Patent Laid-open Publication No. 2017-201611.

SUMMARY

A plasma processing apparatus according to an aspect of the present disclosure includes: a placement table serving as a lower electrode and configured to place thereon a workpiece to be subjected to a plasma processing; a DC power supply configured to alternately generate a positive DC voltage and a negative DC voltage to be applied to the placement table; and a controller configured to control an overall operation of the plasma processing apparatus. The controller is configured to measure a voltage of the workpiece placed on the placement table; calculate, based on the measured voltage of the workpiece, a potential difference between the placement table and the workpiece in a period during which the negative DC voltage is applied to the placement table; and control the DC power supply such that a value of the negative DC voltage applied to the placement table is shifted by a shift amount that decreases the calculated potential difference.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
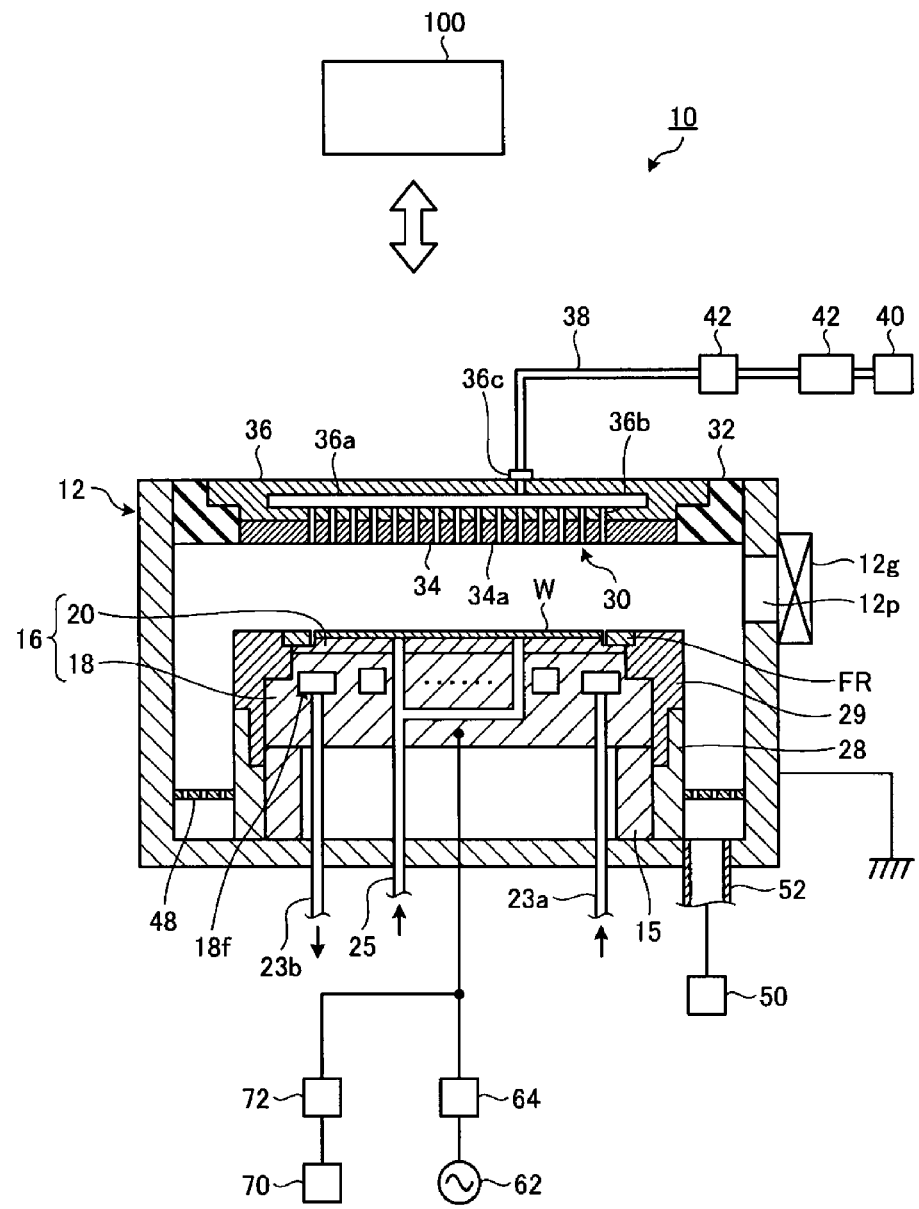
FIG. 1 is a schematic cross-sectional view illustrating a schematic configuration of a plasma processing apparatus according to a first embodiment.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

Hereinafter, various embodiments will be described in detail with reference to the accompanying drawings. In each of the drawings, the same or corresponding components will be denoted by the same reference numerals.

A plasma processing apparatus that performs a plasma processing (e.g., an etching processing) on a workpiece (e.g., a semiconductor wafer) using plasma has been known in the related art. Such a plasma processing apparatus includes a placement table within a processing container that is designed to be capable of forming a vacuum space therein. The placement table is configured to place a workpiece therein and also functions as an electrode of the plasma processing apparatus. In the plasma processing apparatus, a plasma processing is performed on the workpiece placed on the placement table by applying, for example, a predetermined radio-frequency power to the placement table. In some cases, the plasma processing apparatus applies radio-frequency power to the placement table for bias purpose when the plasma processing is performed. By applying radio-frequency power to the placement table for bias purpose, the ions in the plasma are drawn into the workpiece.

Meanwhile, in an etching apparatus, a method of cyclically applying a negative DC voltage to the placement table in place of radio-frequency power for bias has been studied. In the method of periodically applying a negative DC voltage to the placement table, it is possible to adjust the energy of ions to be drawn into a workpiece by appropriately setting the frequency of the negative DC voltage.

However, in the method of periodically applying a negative DC voltage to the placement table, in a period during which the negative DC voltage is applied to the placement table, positive ions in the plasma are drawn into the workpiece, and thus the potential of the plasma is lowered. When the potential of the plasma is lowered, in order to maintain the electric neutrality between the plasma and the workpiece, the voltage of the workpiece fluctuates such that the workpiece and the potential between the placement table on which the workpiece is placed increases. As a result, discharge may occur between the placement table and the workpiece. In the plasma processing apparatus, when discharge occurs between the placement table and the workpiece, there is a possibility that the quality of the workpiece is degraded and the yield is deteriorated.

First Embodiment

[Configuration of Plasma Processing Apparatus]

FIG. 1 is a schematic cross-sectional view illustrating a schematic configuration of a plasma processing apparatus 10 according to a first embodiment. The plasma processing apparatus 10 includes a processing container 12. The processing container 12 has a substantially cylindrical shape. The processing container 12 defines a processing space in which plasma is generated. The processing container 12 is made of, for example, aluminum. The processing container 12 is connected to a ground potential. On the inner wall surface of the processing container 12, a plasma-resistant film is formed. The film may be a film formed by an anodic oxidation processing or a ceramic film such as a film formed from yttrium oxide. In addition, a passage 12p is formed in the side wall of the processing container 12. When a wafer W as the workpiece is carried into the processing container 12 and when a wafer W is carried out from the processing container 12, the wafer W passes through the passage 12p. In order to open and close the passage 12p, a gate valve 12g is provided along the side wall of the processing container 12.

In the processing container 12, the support unit 15 extends upward from the bottom portion of the processing container 12. The support unit 15 has a substantially cylindrical shape, and is formed of an insulating material such as ceramics. A placement table 16 is mounted on the support unit 15. The placement table 16 is supported by the support unit 15. The placement table 16 is configured to support a wafer W in the processing container 12. The placement table 16 includes a base 18 and an electrostatic chuck 20. The base 18 is made of a conductive material such as, for example, aluminum, and has a substantially disk shape. The base 18 has a function as a lower electrode.

In the base 18, a flow path 18f is provided. The flow path 18f is a flow path for a heat exchange medium. As the heat exchange medium, a liquid coolant or a coolant (e.g., fluorocarbon) for cooling the base 18 by vaporization thereof is used. The heat exchange medium is supplied to the flow path 18f from a chiller unit provided outside the processing container 12 through a pipe 23a. The heat exchange medium supplied to the flow path 18f is returned to the chiller unit through a pipe 23b. That is, the heat exchange medium is supplied so as to circulate between the flow path 18f and the chiller unit.

The electrostatic chuck 20 is provided on the base 18. The electrostatic chuck 20 includes a main body formed of an insulator and a film-shaped electrode provided in the main body thereof. A DC power supply is electrically connected to the electrode of the electrostatic chuck 20. When the voltage is applied from the DC power supply to the electrode of the electrostatic chuck 20, an electrostatic attractive force is generated between the wafer W disposed on the electrostatic chuck 20 and the electrostatic chuck 20. Due to the generated electrostatic attractive force, the wafer W is attracted to the electrostatic chuck 20, and held by the electrostatic chuck 20. A focus ring FR is disposed on the peripheral edge region of the electrostatic chuck 20. The focus ring FR has a substantially annular plate shape, and is formed of, for example, silicon. The focus ring FR is disposed so as to surround the edge of the wafer W.

The plasma processing apparatus 10 is provided with a gas supply line 25. The gas supply line 25 supplies a heat transfer gas such as, for example, He gas, from the gas supply mechanism to a space between the upper surface of the electrostatic chuck 20 and the rear surface (lower surface) of the wafer W.

A cylindrical portion 28 extends upward from the bottom portion of the processing container 12. The cylindrical portion 28 extends along the outer periphery of the support unit 15. The cylindrical portion 28 is formed of a conductive material, and has a substantially cylindrical shape. The cylindrical portion 28 is connected to the ground potential. An insulating unit 29 is provided on the cylindrical portion 28. The insulating unit 29 has an insulating property, and is formed of, for example, quartz or ceramics. The insulating unit 29 extends along the outer periphery of the placement table 16.

The plasma processing apparatus 10 further includes an upper electrode 30. The upper electrode 30 is provided above the placement table 16. The upper electrode 30 closes the upper opening of the processing container 12 together with a member 32. The member 32 has an insulating property. The upper electrode 30 is supported in the upper portion of the processing container 12 via the member 32. When a radio-frequency power supply 62 to be described later is electrically connected to the base 18, the upper electrode 30 is connected to the ground potential.

The upper electrode 30 includes a ceiling plate 34 and a support 36. The lower surface of the ceiling plate 34 faces the processing space. The ceiling plate 34 is provided with a plurality of gas ejection holes 34a. Each of the plurality of gas ejection holes 34a penetrates the ceiling plate 34 in the plate thickness direction (the vertical direction). The ceiling plate 34 is formed of, for example, silicon, although it is not limited thereto. Alternatively, the ceiling plate 34 may have a structure in which a plasma-resistant film is provided on the surface of a base material made of aluminum. The film may be a film formed by an anodic oxidation processing or a ceramic film such as a film formed from yttrium oxide.

The support 36 is a component that detachably supports the ceiling plate 34. The support 36 may be formed of a conductive material such as, for example, aluminum. A gas diffusion space 36a is provided inside the support 36. A plurality of gas holes 36b extend downward from the gas diffusion chamber 36a. The plurality of gas holes 36b communicate with the plurality of gas ejection holes 34a, respectively. The support 36 is provided with a gas inlet 36c configured to guide a processing gas to the gas diffusion chamber 36a, and a gas supply pipe 38 is connected to the gas inlet 36c.

To the gas supply pipe 38, a gas source group 40 is connected through a valve group 42 and a flow rate controller group 44. The gas source group 40 includes a plurality of gas sources. The valve group 42 includes a plurality of valves, and the flow rate controller group 44 includes a plurality of flow rate controllers. Each of the plurality of flow rate controllers of the flow rate controller group 44 is a mass flow controller or a pressure control-type flow rate controller. Each of the plurality of gas sources of the gas source group 40 is connected to the gas supply pipe 38 and the gas supply pipe 38 through a corresponding valve of the valve group 42 and a corresponding flow rate controller of the flow rate controller group 44. The plasma processing apparatus 10 is capable of supplying a gas from at least one source selected among the plurality of gas sources of the gas source group 40 into the processing container 12 at an individually adjusted flow rate.

A baffle plate 48 is provided between the cylindrical portion 28 and the side wall of the processing container 12. The baffle plate 48 may be constituted, for example, by coating a ceramic such as, for example, yttrium oxide on an aluminum base material. A large number of through holes are formed in the baffle plate 48. Under the baffle plate 48, an exhaust pipe 52 is connected to the bottom portion of the processing container 12. An exhaust device 50 is connected to the exhaust pipe 52. The exhaust device 50 has a pressure controller such as, for example, an automatic pressure control valve, and a vacuum pump such as, for example, a turbo molecular pump, so that the processing container 12c can be decompressed.

As illustrated in FIG. 1, the plasma processing apparatus 10 further includes a radio-frequency power supply 62. The radio-frequency power supply 62 generates radio-frequency power for generating plasma by exciting the gas in the processing container 12. The radio-frequency power has a frequency within a range of 27 to 100 MHz, for example, a frequency of 60 MHz. The first radio-frequency power supply 62 is connected to the base 18 through a matching circuit 64. The matching circuit 64 is a circuit configured to match the output impedance of the radio-frequency power supply 62 and the load side (base 18 side) impedance.

The plasma processing apparatus 10 further includes a DC power supply 70. The DC power supply 70 alternately generates a positive DC voltage and a negative DC voltage to be applied to the placement table 16 (the base 18). The DC power supply 70 is, for example, a bipolar-type variable DC power supply. The DC power supply 70 is electrically connected to the base 18 through a low-pass filter (LPF) 72. Of the positive DC voltage and the negative DC voltage alternately generated in the DC power supply 70, the negative DC voltage is used as a bias voltage for drawing ions in the plasma into the wafer W placed on the placement table 16. In addition, the DC power supply 70 is configured to be capable of changing the values of the generated positive DC voltage and negative DC voltage under the control of the controller 100 to be described later. In addition, the DC power supply 70 is configured to be capable of changing the duty ratio of the generated positive DC voltage and negative DC voltage under the control of the controller 100. Here, the duty ratio refers to a ratio of a period during which the negative DC voltage is applied to the placement table 16 relative to a period of one cycle in which the positive DC voltage and the negative DC voltage are applied to the placement table 16. In addition, the DC power supply 70 is configured to be capable of changing the sum of the absolute values of the generated positive DC voltage and negative DC voltage under the control of the controller 100. In addition, the DC power supply 70 is configured to be capable of changing the frequency of the generated positive DC voltage and negative DC voltage under the control of the controller 100.

The plasma processing apparatus 10 further includes the controller 100. The controller 100 is, for example, a computer, and controls each unit of the plasma processing apparatus 10.

Figure 2:
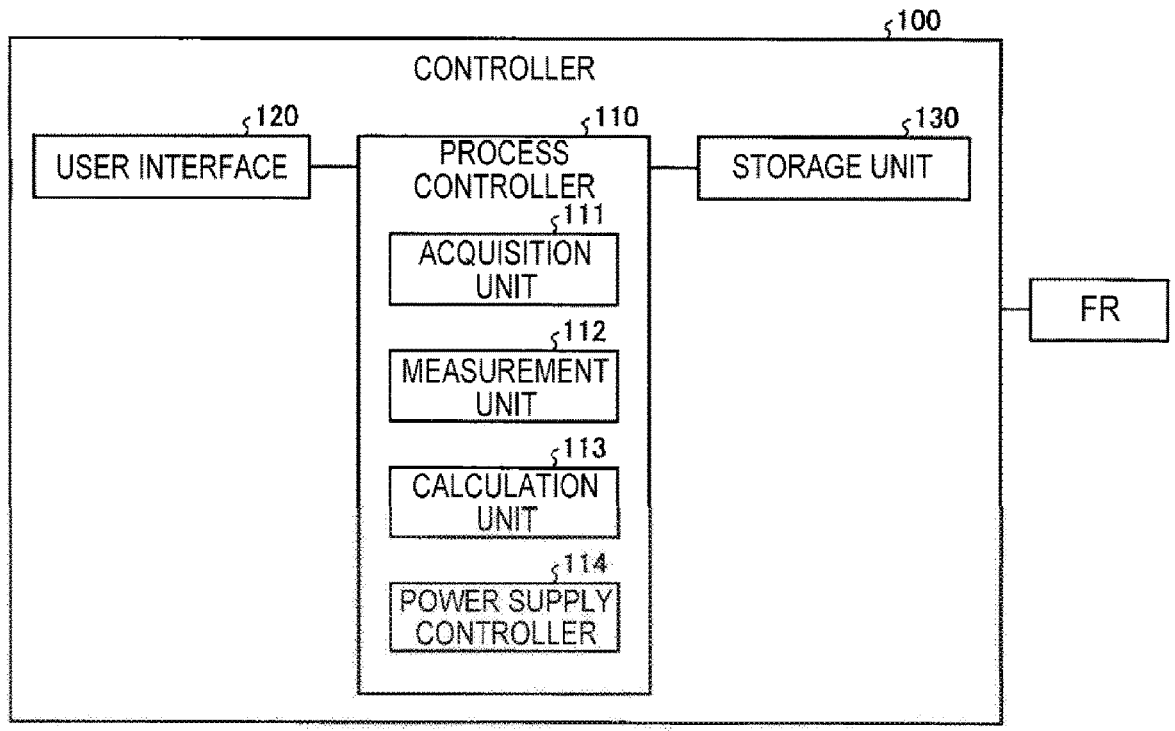
FIG. 2 is a block diagram illustrating an example of a schematic configuration of a controller that controls the plasma processing apparatus according to the first embodiment.

FIG. 2 is a block diagram illustrating an example of a schematic configuration of the controller 100 that controls the plasma processing apparatus 10 according to the first embodiment. The controller 100 includes a process controller 110, a user interface 120, and a storage unit 130.

The process controller 110 includes a central processing unit (CPU), and controls each unit of the plasma processing apparatus 10.

The user interface 120 includes, for example, a keyboard configured to allow a process manager to input commands for managing the plasma processing apparatus 10 therethrough, and a display configured to visualize and display an operation situation of the plasma processing apparatus 10.

The storage unit 130 stores, for example, a control program (software) for implementing various processings executed in the plasma processing apparatus 10 under the control of the process controller 110, and a recipe storing, for example, processing condition data. In addition, the control program and the recipe of, for example, the processing condition data may be used in the state of being stored in a computer-readable computer-recording medium (e.g., a hard disk, an optical disk such as a DVD, a flexible disk, or a semiconductor memory), or may be used online by causing the control program and the recipe to be transmitted from another device via, for example, a dedicated line at any time.

The process controller 110 includes an internal memory that stores programs or data, reads a control program stored in the storage unit 130, and executes a processing of the read control program. The process controller 110 serves as various processing units as the control program operates. For example, the process controller 110 includes an acquisition unit 111, a measurement unit 112, a calculation unit 113, and a power supply controller 114.

Meanwhile, in the plasma processing apparatus 10, when a positive DC voltage and a negative DC voltage are alternately applied to the placement table 16, positive ions in the plasma are drawn into the wafer W in the period during which the negative DC voltage is applied to the placement table 16, and thus the potential of the plasma is lowered. When the potential of the plasma is lowered, the electric potential of the wafer W fluctuates in order to maintain the electrical neutrality between the plasma and the wafer W, and thus the potential difference between the wafer W and the placement table 16 on which the wafer W is placed increases. As a result, discharge may occur between the placement table 16 and the wafer W in some cases.

Figure 3:
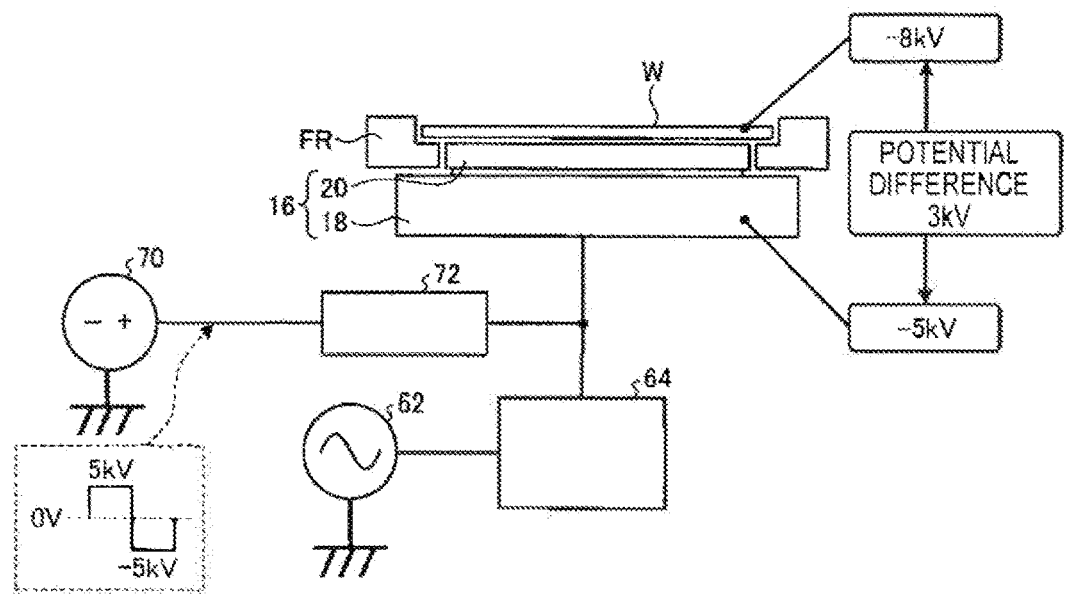
FIG. 3 is a view schematically illustrating an example of the state of potentials of a placement table 16 and a wafer W when a positive DC voltage and a negative DC voltage are alternately applied to the placement table.

FIG. 3 is a view schematically illustrating an example of the potential states of the placement table 16 and the wafer W. As illustrated in FIG. 3, the wafer W is placed on the placement table 16. In addition, the DC power supply 70 alternately generates 5 kV and −5 kV as the positive DC voltage and the negative DC voltage applied to the placement table 16. In the plasma processing apparatus 10, the positive ions in the plasma are drawn into the wafer W in the period during which the negative DC voltage is applied to the placement table 16, whereby the potential of the plasma is lowered. When the potential of the plasma is lowered, the voltage of the wafer W fluctuates in order to maintain the electrical neutrality between the plasma and the wafer W, and thus the potential difference between the wafer W and the placement table 16 on which the wafer W is placed increases. In the example of FIG. 3, in the period during which −5 kV is applied as negative DC voltage to the placement table 16, the voltage of the wafer W fluctuates to −8 kV with respect to −5 kV applied to the placement table 16 (the base 18), and the potential difference between the placement table 16 and the wafer W increases to 3 kV. When the potential difference between the placement table 16 and the wafer W exceeds a limit value causing discharge, discharge occurs between the placement table 16 and the wafer W.

Therefore, in the plasma processing apparatus 10 according to the present embodiment, the DC power supply 70 is controlled depending on the potential difference between the placement table 16 and the wafer W.

Descriptions will be made referring back to FIG. 2. The acquisition unit 111 acquires the sum of the absolute values of the positive DC voltage and the negative DC voltage to be applied from the DC power supply 70 to the placement table 16 as a set voltage value of the DC voltage. For example, the acquisition unit 111 acquires the sum of the absolute values of the positive DC voltage and the negative DC voltage input to the user interface 120 as the set voltage value. The acquisition unit 111 may acquire the set voltage value from, for example, the recipe stored in the storage unit 130. The sum of the absolute values of the positive DC voltage and the negative DC voltage acquired by the acquisition unit 111, that is, the set voltage value is distributed by the power supply controller 114, which will be described later, to the absolute value of the positive DC voltage and the absolute value of the negative DC voltage in a predetermined ratio. Then, the DC power supply 70 alternately generates the positive DC voltage and the negative DC voltage having, as initial values, the absolute value of the positive DC voltage and the absolute value of the negative DC voltage obtained by distributing the set voltage value.

The measurement unit 112 measures the voltage of the wafer W placed on the placement table 16. For example, the measurement unit 112 measures the voltage of the focus ring FR as the voltage of the wafer W using a measurement device (not illustrated) disposed in the vicinity of the focus ring FR that surrounds the wafer W.

Based on the voltage of the wafer W measured by the measurement unit 112, the calculation unit 113 calculates a potential difference between the placement table 16 and the wafer W in the period during which a negative DC voltage is applied to the placement table 16. For example, the calculation unit 113 extracts the voltage of the wafer W in the period during which the negative DC voltage is applied to the placement table 16, from the voltage of the wafer W measured by the measurement unit 112. The calculation unit 113 calculates the difference between the voltage of the wafer W and the negative DC voltage applied to the placement table 16 in the period during which the negative DC voltage is applied to the placement table 16, as the potential difference between the placement table 16 and the wafer W.

The power supply controller 114 controls the DC power supply 70 such that the value of the negative DC voltage applied to the placement table 16 is shifted by the shift amount that decreases the potential difference between the placement table 16 and the wafer W calculated by the calculation unit 113. That is, the power supply controller 114 controls the DC power supply 70 such that the value of the negative DC voltage applied to the placement table 16 is shifted while maintaining the sum of the absolute values of the positive DC voltage and the negative DC voltage applied to the placement table 16. In addition, when the potential difference between the placement table 16 and the wafer W calculated by the calculation unit 113 is equal to or larger than a predetermined threshold, the power supply controller 114 controls the DC power supply 70 to shift the value of the negative DC voltage value applied to the placement table 16 by a shift amount that decreases the potential difference. For example, it is assumed that the potential difference between the placement table 16 and the wafer W in the period during which the negative DC voltage is applied to the placement table 16 is a potential difference ΔV that is equal to or higher than a predetermined threshold value. In this case, the power supply controller 114 controls the DC power supply 70 to shift the value of the negative DC voltage by the potential difference ΔV while maintaining the sum of the absolute values of the positive DC voltage and the negative DC voltage applied to the placement table 16.

Thus, in the plasma processing apparatus 10, the negative DC voltage applied to the placement table 16 is able to be made to coincide with the voltage of the wafer W in the period during which the negative DC voltage is applied to the placement table 16, thereby suppressing the occurrence of discharge between the placement table 16 and the wafer W.

[Flow of Power Supply Control]

Figure 4:
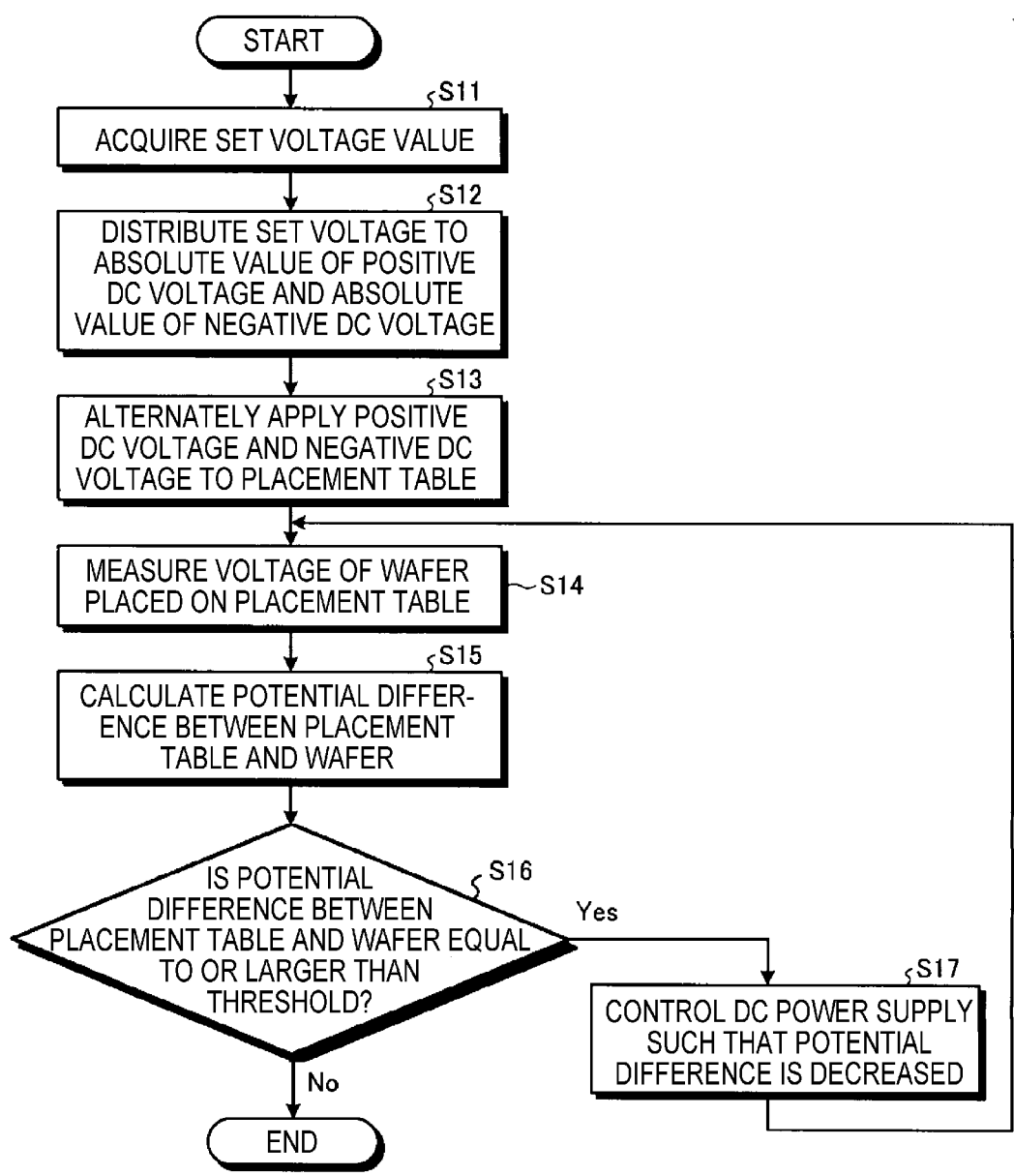
FIG. 4 is a flowchart illustrating an example of the flow of a power supply control method according to the first embodiment.

Next, a power supply control method using the plasma processing apparatus 10 according to the present embodiment will be described. FIG. 4 is a flowchart illustrating an example of the flow of a power supply control method according to the first embodiment. This power supply control method is executed at a predetermined timing, for example, at the timing of starting a plasma processing on a wafer W.

As illustrated in FIG. 4, the acquisition unit 111 acquires the sum of the absolute values of the positive DC voltage and the negative DC voltage to be applied to the placement table 16 from the DC power supply 70 as a set voltage value of a DC voltage (step S11).

The sum of the absolute values of the positive DC voltage and the negative DC voltage acquired by the acquisition unit 0041, that is, the set voltage value is distributed by the power supply controller 114, which will be described later, to the absolute value of the positive DC voltage and the absolute value of the negative DC voltage in a predetermined ratio (step S12). The predetermined ratio is, for example, a ratio at which the absolute value of the negative DC voltage is larger than the absolute value of the positive DC voltage. The predetermined ratio may be a ratio at which the absolute value of the positive DC voltage is 0 and the absolute value of the negative DC voltage is the set voltage value.

The DC power supply 70 alternately applies a positive DC voltage and a negative DC voltage, which have the absolute value of the positive DC voltage and the absolute value of the negative DC voltage obtained by distributing the set voltage value by the power supply controller 114 as initial values, to the placement table 16 (step S13).

The measurement unit 112 measures the voltage of the wafer W placed on the placement table 16 (step S14).

Based on the measured voltage of the wafer W, the calculation unit 113 calculates a potential difference between the placement table 16 and the wafer W in the period during which a negative DC voltage is applied to the placement table 16 (step S15).

When the calculated potential difference between the placement table 16 and the wafer W is equal to or larger than a predetermined threshold (Yes in step S16), the power supply controller 114 performs the following processing. That is, the power supply controller 114 controls the DC power supply 70 such that the value of the negative DC voltage applied to the placement table 16 is shifted by a shift amount that decreases the potential difference (step S17), and returns the processing to step S14. Meanwhile, when the calculated potential difference between the placement table 16 and the wafer W is smaller than the predetermined threshold (No in step S16), the power supply controller 114 terminates the processing.

Figure 5:
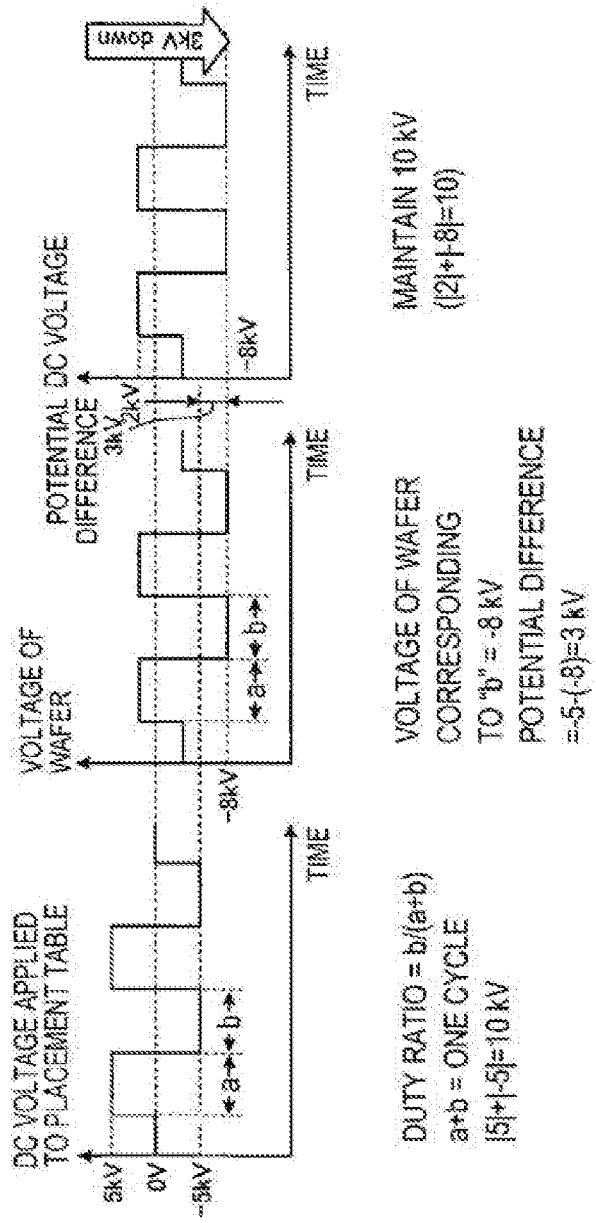
FIGS. 5A to 5C are views for describing a specific example of a power supply control method using the plasma processing apparatus according to the first embodiment.

Next, a specific example of the power supply control method using the plasma processing apparatus 10 according to the present embodiment will be described. FIGS. 5A to 5C are views for describing a specific example of the power supply control method using the plasma processing apparatus 10 according to the first embodiment.

For example, as illustrated in FIGS. 5A and 5B, it is assumed that 5 kV and −5 kV are alternately applied to the placement table 16 as DC voltages from the DC power supply 70, and the voltage of the wafer W is −8 kV in the period during which −5 kV is applied to the placement table 16. In this case, the potential difference between the placement table 16 and the wafer W is 3 kV. Therefore, as illustrated in FIG. 5C, in the plasma processing apparatus 10, the positive DC voltage and the negative DC voltage are shifted to the negative side by the potential difference 3 kV, meanwhile the absolute value of the positive DC voltage and the negative DC voltage applied to the placement table, 10 kV, is maintained. Thus, in the plasma processing apparatus 10, the negative DC voltage applied to the placement table 16 is able to be made to coincide with the voltage of the wafer W in the period during which the negative DC voltage is applied to the placement table 16, thereby suppressing the occurrence of discharge between the placement table 16 and the wafer W.

Figure 6:
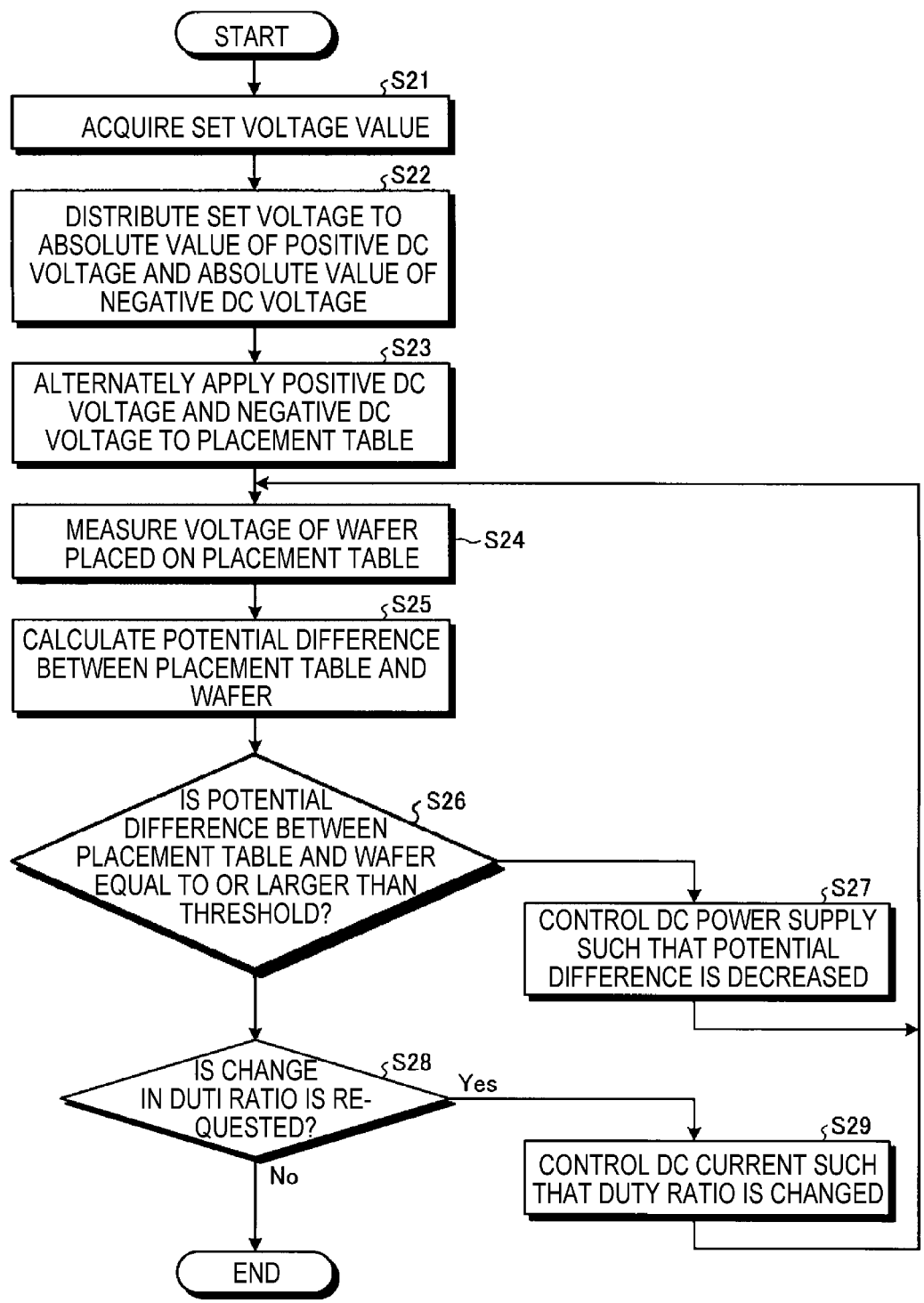
FIG. 6 is a flowchart illustrating Modification 1 to the flow of the power supply control method according to the first embodiment.

Next, modifications to the power supply control method using the plasma processing apparatus 10 according to the present embodiment will be described. FIG. 6 is a flowchart illustrating Modification 1 to the flow of the power supply control method according to the first embodiment. In FIG. 6, since steps S21 to S27 correspond to steps S11 to S17 illustrated in FIG. 4, a detailed description thereof will be omitted.

As illustrated in FIG. 6, when the calculated potential difference between the placement table 16 and the wafer W is smaller than a predetermined threshold (No in step S26), the power supply controller 114 determines whether or not a change in duty ratio is requested (step S28). The change in duty ratio is requested, for example, via the user interface 120.

When the change in duty ratio is requested (Yes in step S28), the power supply controller 114 controls the DC power supply 70 such that the duty ratio is changed (step S29) and returns the processing to step S24. For example, the power supply controller 114 controls the DC power supply 70 to reduce the duty ratio with the elapse of the plasma processing time on the wafer W. In other words, since the potential of the plasma is lowered as the duty ratio becomes smaller, in other words, as the period during which the negative DC voltage is applied to the placement table 16 decreases, a damage applied from the plasma to, for example, the side wall of the processing container 12 is reduced. Meanwhile, when the change in duty ratio is not requested (No in step S28), the power supply controller 114 terminates the processing.

Figure 7:
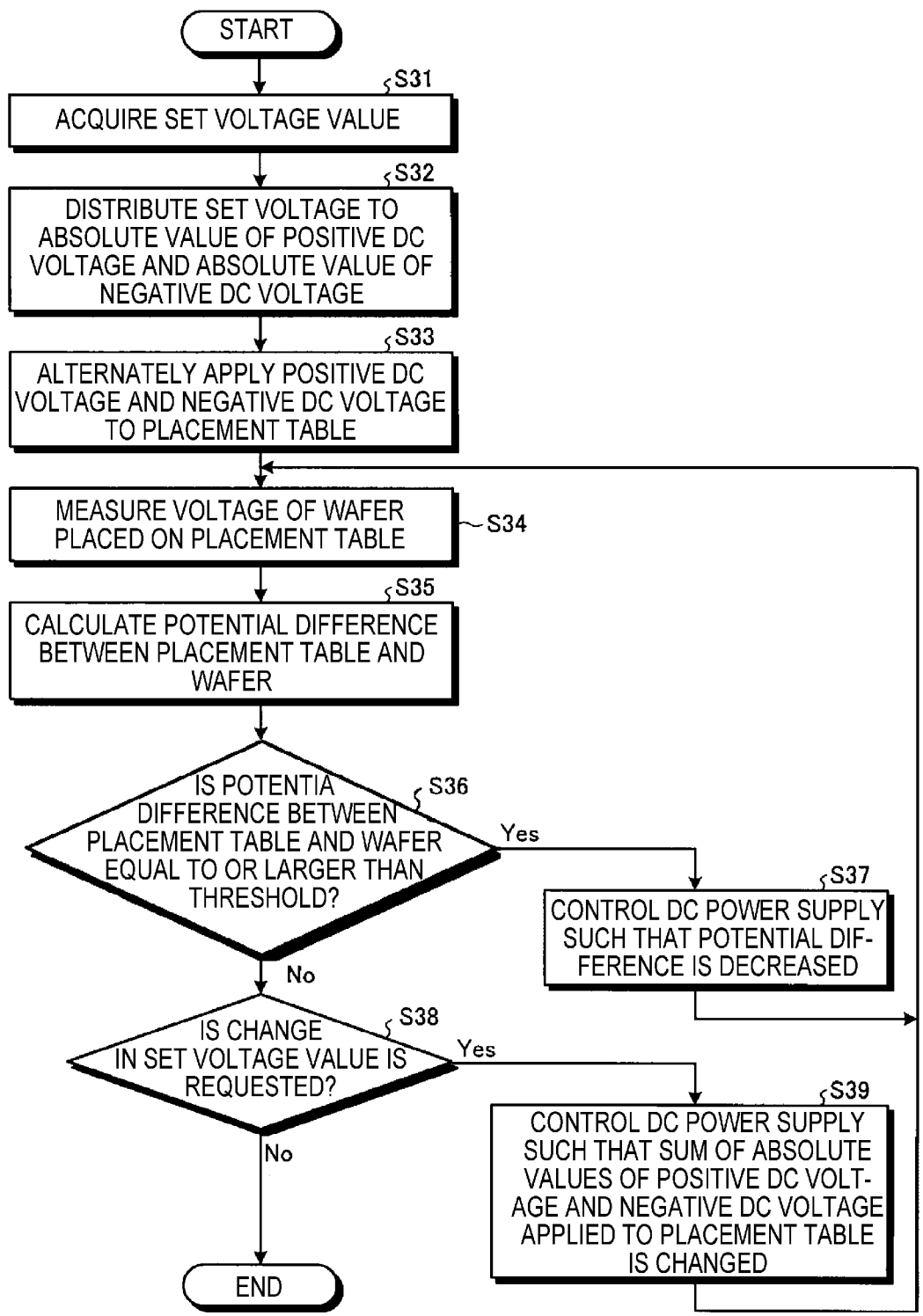
FIG. 7 is a flowchart illustrating Modification 2 to the flow of the power supply control method according to the first embodiment.

FIG. 7 is a flowchart illustrating Modification 2 to the flow of the power supply control method according to the first embodiment. In FIG. 7, since steps S31 to S37 correspond to steps S11 to S17 illustrated in FIG. 4, a detailed description thereof will be omitted.

As illustrated in FIG. 7, when the calculated potential difference between the placement table 16 and the wafer W is smaller than a predetermined threshold (No in step S36), the power supply controller 114 determines whether or not a change in set voltage value is requested (step S38). Here, the set voltage value is the sum of the absolute values of the positive DC voltage and the negative DC voltage acquired in step S31. The change in set voltage value is requested, for example, via the user interface 120.

When the change in set voltage value is requested (Yes in step S38), the power supply controller 114 controls the DC power supply 70 such that the sum of the absolute values of the positive DC voltage and the negative DC voltage applied to the placement table 16 is changed (step S39), and returns the processing to step S34. For example, the power supply controller 114 controls the DC power supply 70 to increase the sum of the absolute values of the positive DC voltage and the negative DC voltage applied to the placement table 16. As the sum of the absolute values of the positive DC voltage and the negative DC voltage applied to the placement table 16 increases, the energy of the ions drawn into the wafer W from the plasma increases, and thus it becomes possible to improve the etching rate of the wafer W. Meanwhile, when the change in set voltage value is not requested (No in step S38), the power supply controller 114 terminates the processing.

Figure 8:
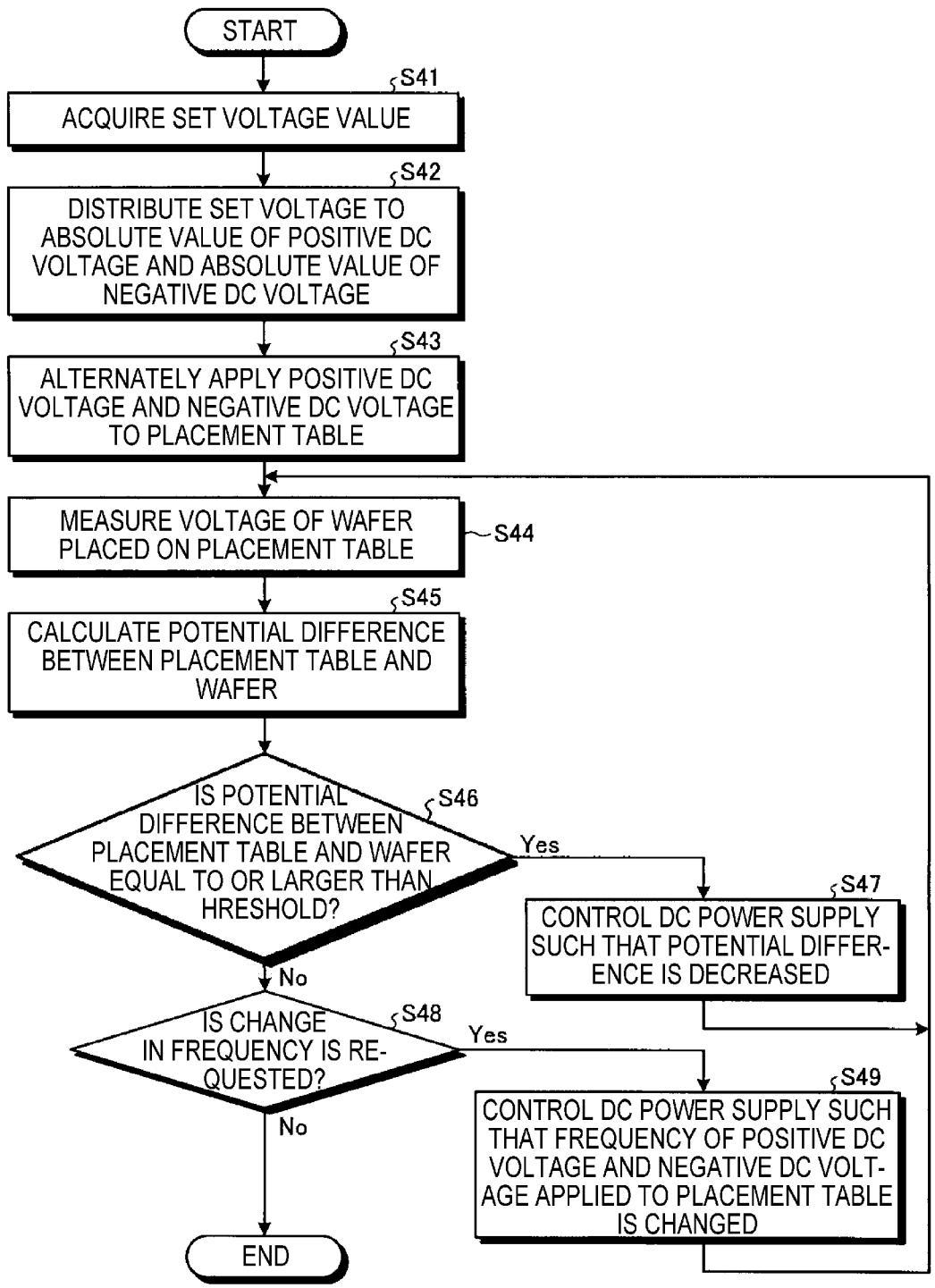
FIG. 8 is a flowchart illustrating Modification 3 to the flow of the power supply control method according to the first embodiment.

FIG. 8 is a flowchart illustrating Modification 3 to the power supply control method according to the first embodiment. In FIG. 8, since steps S41 to S47 correspond to steps S11 to S17 illustrated in FIG. 4, a detailed description thereof will be omitted.

As illustrated in FIG. 8, when the calculated potential difference between the placement table 16 and the wafer W is smaller than a predetermined threshold (No in step S46), the power supply controller 114 determines whether or not a change in frequency is requested (step S48). Here, the frequency refers to the frequency of the positive DC voltage and the negative DC voltage applied to the placement table 16. The change in frequency is requested, for example, via the user interface 120.

When the change in frequency is requested (Yes in step S48), the power supply controller 114 controls the DC power supply 70 such that the frequency of the positive DC voltage and the negative DC voltage applied to the placement table 16 is changed (step S49), and returns the processing to step S34. For example, the power supply controller 114 controls the DC power supply 70 to decrease the frequency of the positive DC voltage and the negative DC voltage applied to the placement table 16 with the elapse of as the plasma processing time. As the frequency of the positive DC voltage and the negative DC voltage applied to the placement table 16 is decreased, the energy of the ions drawn into the wafer W from the plasma increases, and thus it becomes possible to improve the etching rate of the wafer W while maintaining the shape of an etching hole. Meanwhile, when the change in frequency is not requested (No in step S48), the power supply controller 114 terminates the processing.

As described above, the plasma processing apparatus 10 according to the first embodiment includes the placement table 16, the DC power supply 70, the measurement unit 112, the calculation unit 113, and the power supply controller 114. A wafer W to be subjected to a plasma processing is placed on the placement table 16, and the placement table 16 serves as a lower electrode. The DC power supply 70 alternately generates a positive DC voltage and a negative DC voltage to be applied to the placement table 16. The measurement unit 112 measures the voltage of the wafer W placed on the placement table 16. Based on the measured voltage of the wafer W, the calculation unit 113 calculates a potential difference between the placement table 16 and the wafer W in the period during which a negative DC voltage is applied to the placement table 16. The power supply controller 114 controls the DC power supply 70 such that the value of the negative DC voltage applied to the placement table 16 is shifted by the shift amount that decreases the calculated potential difference between the placement table 16 and the wafer W. Thus, the negative DC voltage applied to the placement table 16 is able to be made to coincide with the voltage of the wafer W in the period during which the negative DC voltage is applied to the placement table 16, and as a result, it is possible to suppress the occurrence discharge between the placement table 16 and the wafer W.

Second Exemplary Embodiment

[Configuration of Plasma Processing Apparatus]

Next, a second exemplary embodiment will be described. Since the plasma processing apparatus 10 according to the second exemplary embodiment is the same as the plasma processing apparatus 10 according to the first exemplary embodiment illustrated in FIG. 1, a detailed description thereof will be omitted. Here, a controller 100 according to the second exemplary embodiment will be described in detail.

Figure 9:
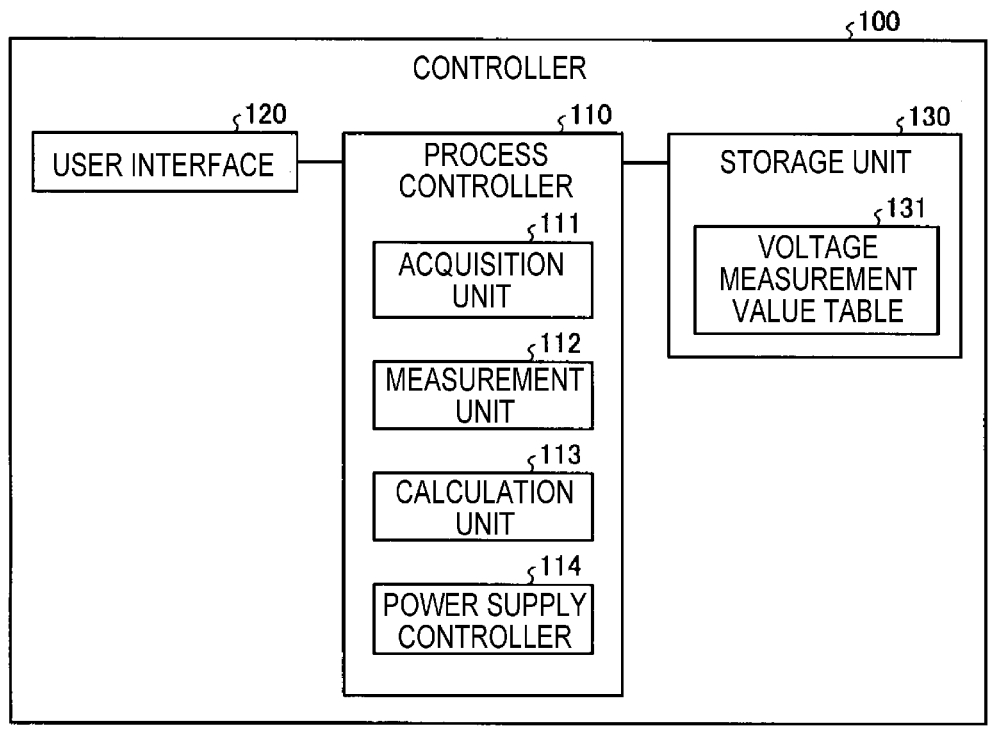
FIG. 9 is a block diagram illustrating an example of a schematic configuration of a controller that controls a plasma processing apparatus according to a second embodiment.

FIG. 9 is a block diagram illustrating an example of a schematic configuration of the controller 100 that controls the plasma processing apparatus 10 according to the second embodiment. Since the controller 100 according to the second embodiment has substantially the same configuration as that of the controller 100 according to the first embodiment illustrated in FIG. 2, the same components are denoted by the same reference numerals, and different components are mainly described.

A voltage measurement value table 131 is stored in the storage unit 130. In the voltage measurement value table 131, each sum of the absolute values of the positive DC voltage and the negative DC voltage to be applied to the placement table 16 is stored to be associated with a measurement value of the voltage of the wafer W measured in advance in the period during which the negative DC voltage is applied to the placement table 16.

The measurement unit 112 measures the voltage of the wafer W placed on the placement table 16. In the present embodiment, the measurement unit 112 measures a measurement value associated with the sum of the absolute values of the positive DC voltage and the negative DC voltage acquired by the acquisition unit 111 as the voltage of the wafer W with reference to the voltage measurement value table 131.

Thus, in the plasma processing apparatus 10, since it is possible to measure the voltage of the wafer W without using, for example, a device for measuring the voltage of the wafer W, it is possible to suppress the occurrence of discharge between the placement table 16 and the wafer W with a simple configuration.

[Flow of Power Supply Control]

Figure 10:
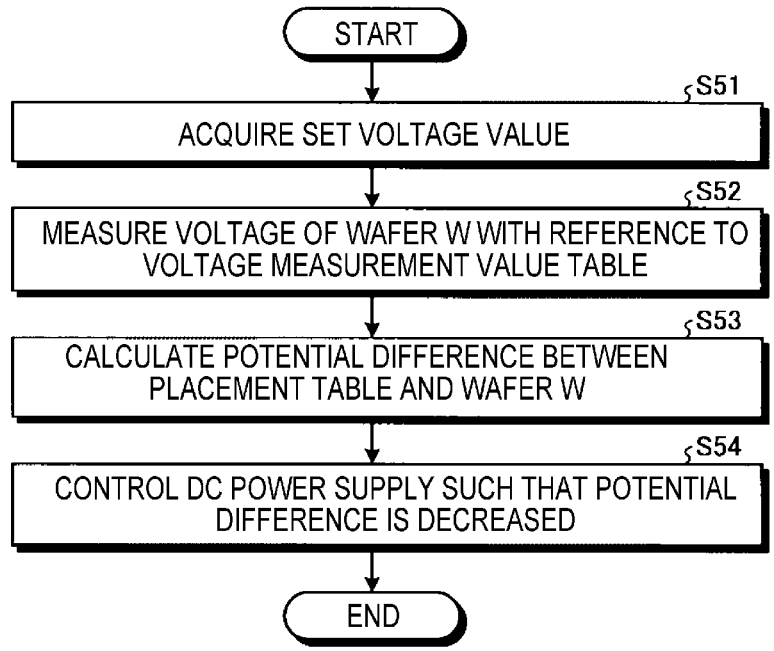
FIG. 10 is a flowchart illustrating an example of the flow of a power supply control method according to the second embodiment.

Next, a power supply control method using the plasma processing apparatus 10 according to the present embodiment will be described. FIG. 10 is a flowchart illustrating an example of the flow of a power supply control method according to the second embodiment. This power supply control method is executed at a predetermined timing, for example, at the timing of starting a plasma processing on a wafer W.

As illustrated in FIG. 10, the acquisition unit 111 acquires the sum of the absolute values of the positive DC voltage and the negative DC voltage to be applied to the placement table 16 from the DC power supply 70 as a set voltage value of a DC voltage (step SM).

The measurement unit 112 measures a measurement value associated with the sum of the absolute values of the acquired positive DC voltage and negative DC voltage with reference to the voltage measurement value table 131, as the voltage of the wafer W (step S52).

Based on the measured voltage of the wafer W, the calculation unit 113 calculates a potential difference between the placement table 16 and the wafer W in the period during which a negative DC voltage is applied to the placement table 16 (step S53).

The power supply controller 114 controls the DC power supply 70 such that the calculated potential difference decreases while the absolute values of the positive DC voltage and the negative DC voltage applied to the placement table 16 are maintained (step S54), and terminates the processing.

As described above, the plasma processing apparatus 10 according to the second embodiment measures a measurement value associated with to the sum of the absolute values of the acquired positive DC voltage and negative DC voltage with reference to the voltage measurement value table 131, as the voltage of the wafer W. Thus, since it is possible to measure the voltage of the wafer W without using, for example, a device for measuring the voltage of the wafer W, it is possible to suppress the occurrence of discharge between the placement table 16 and the wafer W with a simple configuration.

In the exemplary embodiments described above, descriptions have been made on the case in which the potential difference between the placement table 16 and the wafer W in a period during which the negative DC voltage is applied to the placement table 16 is calculated and the DC power supply 70 is controlled such that the calculated potential difference decreases by way of an example. However, the disclosed technique is not limited thereto. For example, a first potential difference between the placement table 16 and the wafer W in a period during which a negative DC voltage is applied to the placement table 16 and a second potential difference between the placement table 16 and the wafer W in a period during which a positive DC voltage is applied to the placement table 16 may be calculated. In this case, the plasma processing apparatus 10 controls the DC power supply 70 such that both the calculated first and second potential differences decrease. That is, the plasma processing apparatus 10 controls the DC power supply 70 such that the value of the negative DC voltage applied to the placement table 16 is shifted by a shift amount that decreases both the calculated first and second potential differences. For example, it is assumed that the first potential difference is $\Delta V1$ and the second potential difference is $\Delta V2$. In this case, the plasma processing apparatus 10 shifts the negative DC voltage applied from the DC power supply 70 to the placement table 16 by $(\Delta V1+\Delta V2)/2$, which is an intermediate value between the first potential difference and the second potential difference, thereby decreasing both the first potential difference and the second potential difference.

Figure 11:
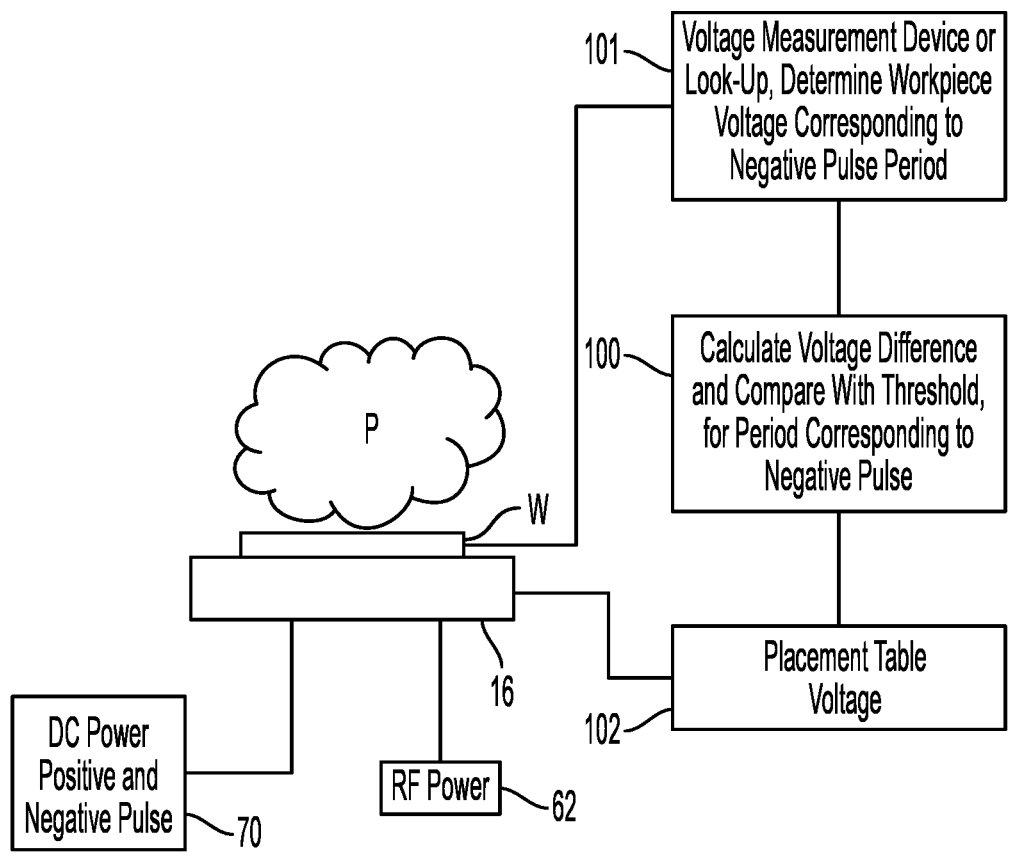
FIG. 11 is a schematic overview of an apparatus and method according to the present disclosure.

FIG. 11 is a schematic overview and equivalent circuit according to an example of the present disclosure. As discussed earlier, DC power supply 70 applies alternating negative and positive pulses of DC power. In addition, at least one additional power supply, such as RF power supply 62 is also provided to form a plasma P. As also discussed earlier, during application of the negative pulse from DC power supply 70, ions are drawn from the plasma P toward the workpiece W, which can cause a change in the potential of the plasma P, and thereby also cause the voltage of the workpiece W to vary, and cause a potential difference between the workpiece W and placement table 16. Accordingly, as indicated at 101, a voltage is determined for the workpiece W corresponding to the period during which the negative pulse is applied by DC power supply 70. As discussed earlier this can be by a workpiece voltage measurement or focus ring voltage measurement, or by way of a stored value such as a look-up of stored measurement values (FIG. 9). As also discussed in connection with FIGS. 5A and 5B, a voltage value during time b is thus obtained or determined for the workpiece (FIG. 5B) corresponding to the time b during which the negative voltage pulse is applied to the placement table (FIG. 5A). As also discussed earlier, the controller 100 calculates a difference between the placement table voltage (represented at 102 in FIG. 11) and the workpiece voltage corresponding to the period during which the negative pulse voltage is applied by DC power supply 70. The voltage difference is then compared to a threshold value, and as also discussed earlier, if the voltage difference corresponding to the negative pulse period exceeds the threshold value, the value of the negative pulse voltage is changed so that the voltage difference does not exceed the threshold value.

According to the present disclosure, it is possible to suppress the occurrence of discharge between a placement table and a workpiece.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A plasma processing apparatus comprising:
   a placement table serving as a lower electrode and including an electrostatic chuck, the placement table being configured to place a workpiece to be subjected to a plasma processing on the electrostatic chuck;
   a DC power supply connected to the placement table and configured to generate a positive DC voltage and a negative DC voltage to be alternately applied to the placement table; and
   a controller configured to control an overall operation of the plasma processing apparatus,
   wherein the controller is configured to:
   acquire a set voltage value which is a sum of absolute values of the positive DC voltage and the negative DC voltage to be applied to the placement table:
   alternately apply the positive DC voltage and the negative DC voltage to the placement table by the DC power supply in a pulse form;
   determine a voltage of the workpiece placed on the electrostatic chuck of the placement table corresponding to a period during which the negative DC voltage is applied to the placement table;
   calculate, based on the determined voltage of the workpiece, a potential difference between the placement table and the workpiece corresponding to the period during which the negative DC voltage is applied to the placement table, the period being a portion of a period during which the positive DC voltage and the negative DC voltage are alternately applied to the placement table;
   determine whether the potential difference between the placement table and the workpiece corresponding to the period during which the negative DC voltage is applied is equal to or greater than a predetermined threshold value; and
   in response to a determination that the potential difference between the placement table and the workpiece is equal to or larger than the predetermined threshold value, controlling the power supply so that the potential difference between the placement table and the workpiece in the period during which the negative DC voltage is applied is reduced to below the threshold value, and wherein the controlling the power supply also includes at least one of:
   changing a duty ratio of the DC power supply applied to the placement table,
   changing a frequency of the DC power supply applied to the placement table, or
   changing a voltage value of the DC power supply applied to the placement table.

2. The plasma processing apparatus according to claim 1, wherein the controller is configured to receive a request from a user to change the duty ratio of the DC power supply, and to control the DC power supply to change the duty ratio of the DC power supply in response to the request, the duty ratio defined by the period during which the negative DC voltage is applied to the placement table relative to a period of one cycle where the positive DC voltage and the negative DC voltage are alternately applied.

3. The plasma processing apparatus according to claim 2, wherein the controller is configured to receive the set voltage value requested from a user corresponding to the sum of absolute values of the positive DC voltage and the negative DC voltage, the controller further configured to control the DC power supply according to the requested set voltage value.

4. The plasma processing apparatus according to claim 3, wherein the controller is configured to receive a frequency requested by a user and to control the DC power supply according to the requested frequency.

5. The plasma processing apparatus according to claim 1, wherein the controller is configured to receive the set voltage value requested from a user corresponding to the sum of absolute values of the positive DC voltage and the negative DC voltage, the controller further configured to control the DC power supply according to the requested set voltage value.

6. The plasma processing apparatus according to claim 1, wherein the controller is configured to receive a frequency requested by a user and to control the DC power supply according to the requested frequency.

7. The plasma processing apparatus according to claim 1, wherein, the controller is further configured to:
   control the DC power supply such that the set voltage value is distributed to the positive DC voltage and the negative DC voltage according to a predetermined ratio.

8. The plasma processing apparatus according to claim 1, wherein, based on the determined voltage of the workpiece, the controller calculates a first potential difference between the placement table and the workpiece corresponding to the period during which the negative DC voltage is applied to the placement table and a second potential difference between the placement table and the workpiece corresponding to a period during which the positive DC voltage is applied to the placement table, and wherein the controller controls the DC power supply such that the value of the negative DC voltage applied to the placement table is changed so that both of the first potential difference and the second potential difference are reduced.

9. The plasma processing apparatus according to claim 8, wherein the value of the negative DC voltage applied to the placement table is changed by a value obtained by dividing a sum of the first potential difference and the second potential difference by two.

10. The plasma processing apparatus according to claim 1, wherein the value of the negative DC voltage is changed by a calculated voltage change amount.

11. The plasma processing apparatus according to claim 1, wherein the controller is configured to control the DC power supply so that after changing the value of the negative DC voltage applied to the placement table, the sum of absolute values of the positive DC voltage and the negative DC voltage is maintained to the set voltage value.

12. A plasma processing method comprising:
providing a plasma processing apparatus comprising:
a placement table provided in a processing container and serving as a lower electrode and including an electrostatic chuck, the placement table being configured to place a workpiece to be subjected to a plasma processing on the electrostatic chuck;
a DC power supply connected to the placement table and configured to generate a positive DC voltage and a negative DC voltage to be alternately applied to the placement table; and
a controller configured to control an overall operation of the plasma processing apparatus,
alternately applying the positive DC voltage and the negative DC voltage to the placement table by the DC power supply in a pulse form;
acquiring, with the controller, a set voltage value which is a sum of absolute values of the positive DC voltage and the negative DC voltage to be applied to be applied to the placement table;
determining, by the controller, a voltage of the workpiece placed on the electrostatic chuck of the placement table corresponding to a period during which the negative DC voltage is applied to the placement table;
calculating, by the controller and based on the determined voltage, a potential difference between the placement table and the workpiece corresponding to the period during which a negative DC voltage is applied to the placement table, the period being a portion of a period during which the positive DC voltage and the negative DC voltage are alternately applied to the placement table;
determining, by the controller, whether the potential difference between the placement table and the workpiece corresponding to the period during which the negative DC voltage is applied is equal to or larger than a predetermined threshold value, and
in response to a determination that the potential difference between the placement table and the workpiece is equal to or larger than the predetermined threshold value, controlling the power supply so that the potential difference between the placement table and the workpiece in the period during which the negative DC voltage is applied is reduced to below the threshold value, and wherein the controlling the power supply also includes at least one of:
changing a duty ratio of the DC power supply applied to the placement table,
changing a frequency of the DC power supply applied to the placement table, or
changing a voltage value of the DC power supply applied to the placement table.

* * * * *